US012654282B2

(12) United States Patent
Ruggeri et al.

(10) Patent No.: US 12,654,282 B2
(45) Date of Patent: Jun. 16, 2026

(54) MONITORING SYSTEM FOR A MOVABLE COMPONENT CONNECTED TO A STATIONARY COMPONENT

(71) Applicant: Marposs Societa' Per Azioni, Bentivoglio (IT)

(72) Inventors: Alessandro Ruggeri, Bologna (IT); Daniele Lanzoni, Cento (IT); Andrea Turrini, Bologna (IT); Claudio De Simone, Due Carrare (IT); Christian Wurm, Pfaffenhausen (DE)

(73) Assignee: Marposs Societa' Per Azioni, Bentivoglio (IT)

( * ) Notice: Subject to any disclaimer, the term of this patent is extended or adjusted under 35 U.S.C. 154(b) by 407 days.

(21) Appl. No.: 18/257,316

(22) PCT Filed: Dec. 17, 2021

(86) PCT No.: PCT/EP2021/086454
§ 371 (c)(1),
(2) Date: Jun. 14, 2023

(87) PCT Pub. No.: WO2022/129502
PCT Pub. Date: Jun. 23, 2022

(65) Prior Publication Data
US 2024/0075585 A1     Mar. 7, 2024

(30) Foreign Application Priority Data

| Dec. 18, 2020 | (IT) | .................. | 102020000031346 |
| Dec. 18, 2020 | (IT) | .................. | 102020000031349 |
| Dec. 18, 2020 | (IT) | .................. | 102020000031355 |

(51) Int. Cl.
B24B 49/00 (2012.01)
B24B 49/10 (2006.01)
(Continued)

(52) U.S. Cl.
CPC ............ B24B 49/003 (2013.01); B24B 49/00 (2013.01); B24B 49/10 (2013.01); B24B 49/12 (2013.01);
(Continued)

(58) Field of Classification Search
CPC ........... G05B 19/4065; G05B 23/0208; H03M 1/1205; B24B 49/12; B24B 49/003;
(Continued)

(56) References Cited

U.S. PATENT DOCUMENTS

| 4,266,428 A | 5/1981 | Ho |
| 5,688,160 A | 11/1997 | Pozzetti et al. |

(Continued)

FOREIGN PATENT DOCUMENTS

| CN | 101660891 A | 3/2010 |
| CN | 104518796 A | 4/2015 |

(Continued)

OTHER PUBLICATIONS

Gao R X et al., "Acoustic Emission Measurement for the In-Process Monitoring of Diamond Turning", Proceedings of the Instrumentation and Measurement Technology Conference. Advanced Technologies in I & M. Hamamatsu, May 10-12, 1994; [Proceedings of the Instrumentation and Measurement Technology Conference], New York, IEEE, US, (May 10, 1994), vol. 2, doi:10.1109/IMTC. 1994.35199 o, ISBN 978-0-7803-1881-6, pp. 757-760, XP000509614.

*Primary Examiner* — An H Do
(74) *Attorney, Agent, or Firm* — Blank Rome LLP

(57) ABSTRACT

A monitoring system for a mobile component, such as a rotating component, that is supported by a stationary component is described. The monitoring system includes an acoustic sensor positioned in the mobile component, a first amplifier positioned in the mobile component, a contactless communication unit including a first transceiver positioned (Continued)

in the mobile component and a second transceiver facing the first transceiver device and positioned in the stationary component, a first connection line connecting the sensor to the first amplifier, an analog-to-digital converter positioned in the movable component and configured to receive an analog signal from the first amplifier and convert the analog signal into a digital signal, and a processor positioned in the movable component and configured to receive the digital signal from the analog-to-digital converter, process the digital signal, and output the processed digital signal.

19 Claims, 7 Drawing Sheets

(51) Int. Cl.

| | |
|---|---|
| *B24B 49/12* | (2006.01) |
| *G01N 29/22* | (2006.01) |
| *G01N 29/36* | (2006.01) |
| *G01N 29/44* | (2006.01) |
| *G01S 15/50* | (2006.01) |
| *G05B 19/4065* | (2006.01) |
| *G05B 23/02* | (2006.01) |
| *H03M 1/12* | (2006.01) |

(52) U.S. Cl.
CPC ............. *G01N 29/36* (2013.01); *G01N 29/44* (2013.01); *G05B 19/4065* (2013.01); *G05B 23/0208* (2013.01); *H03M 1/1205* (2013.01); *G01N 29/22* (2013.01); *G01S 15/50* (2013.01)

(58) Field of Classification Search
CPC ........ B24B 49/10; B24B 49/00; G01N 29/36; G01N 29/44; G01N 29/22; G01S 15/50
See application file for complete search history.

(56) References Cited

U.S. PATENT DOCUMENTS

| | | | | |
|---|---|---|---|---|
| 10,228,669 | B2 * | 3/2019 | Dunkin | ................. G05B 15/02 |
| 10,809,123 | B2 * | 10/2020 | Ketelaer | ................... B24B 1/04 |
| 2005/0112998 | A1 | 5/2005 | Matsuo et al. | |
| 2005/0193819 | A1 | 9/2005 | Trionfetti et al. | |
| 2005/0210986 | A1 | 9/2005 | Dondi | |
| 2014/0132430 | A1 | 5/2014 | Steensgaard-Madsen | |
| 2015/0091744 | A1 | 4/2015 | Shen et al. | |
| 2020/0209020 | A1 | 7/2020 | Issa et al. | |
| 2020/0209417 | A1 | 7/2020 | Englund | |
| 2022/0206456 | A1 * | 6/2022 | Mori | ................. G05B 19/4063 |

FOREIGN PATENT DOCUMENTS

| | | |
|---|---|---|
| CN | 106232297 A | 12/2016 |
| CN | 207991999 U | 10/2018 |
| CN | 110914645 A | 3/2020 |
| EP | 0 690 979 A | 1/1996 |
| EP | 1 870 198 A | 12/2007 |
| EP | 3 134 980 B1 | 8/2019 |
| JP | 2007-41928 A | 2/2007 |
| TW | 200526359 A | 8/2005 |
| WO | 2015/162154 A1 | 10/2015 |
| WO | 2020201035 A1 | 10/2020 |

* cited by examiner

MONITORING SYSTEM FOR A MOVABLE COMPONENT CONNECTED TO A STATIONARY COMPONENT

TECHNICAL FIELD

The present invention relates to a monitoring system for a movable component, for example a rotating component, connected to a stationary component.

The present invention can advantageously be applied to a monitoring system, which uses an acoustic signal, for a rotating spindle that supports (at least) one grinding wheel in a machine tool, to which the following discussion will make explicit reference without losing generality.

BACKGROUND ART

As described for example in patent applications No. EP0690979A1, EP1870198A1 and EP3134980A1, a rotating spindle (hub) of a machine tool (in particular a grinding machine) which supports (at least) one grinding wheel and is provided with a balancing head housed in an axial cavity is known. The balancing head includes at least one balancing mass eccentric with respect to the rotation axis, the position of which is adjustable and controlled by an electric motor.

Generally, the balancing head also comprises a vibration sensor (i.e. a microphone) for detecting the ultrasonic acoustic emissions caused by the contact between the grinding wheel and the workpiece or between the grinding wheel and a dressing tool (dresser). The electrical signals generated by the vibration sensor are used (in a known way) to control the machining cycles.

The microphone is part of a monitoring system in which the electrical signals provided by the microphone are processed to provide information on the correctness of the machining process. A control unit of the machine tool can subsequently act on the process on the basis of such information.

DISCLOSURE OF THE INVENTION

Object of the present invention is to provide a monitoring system for a movable component connected to a stationary component that allows to detect the effect of an action in progress, such as the machining of a workpiece or the dressing of the grinding wheel, in an accurate and stable way and that, preferably, is easy to install even in tight spaces.

The present invention provides a monitoring system for a movable component connected to a stationary component, as defined in the attached claims.

The claims describe embodiments of the present invention and form an integral part of the present description.

BRIEF DESCRIPTION OF THE DRAWINGS

The present invention is described with reference to the attached drawings, which illustrate non-limiting examples of embodiments, in which.

BEST MODE FOR CARRYING OUT THE INVENTION

Figure 1:
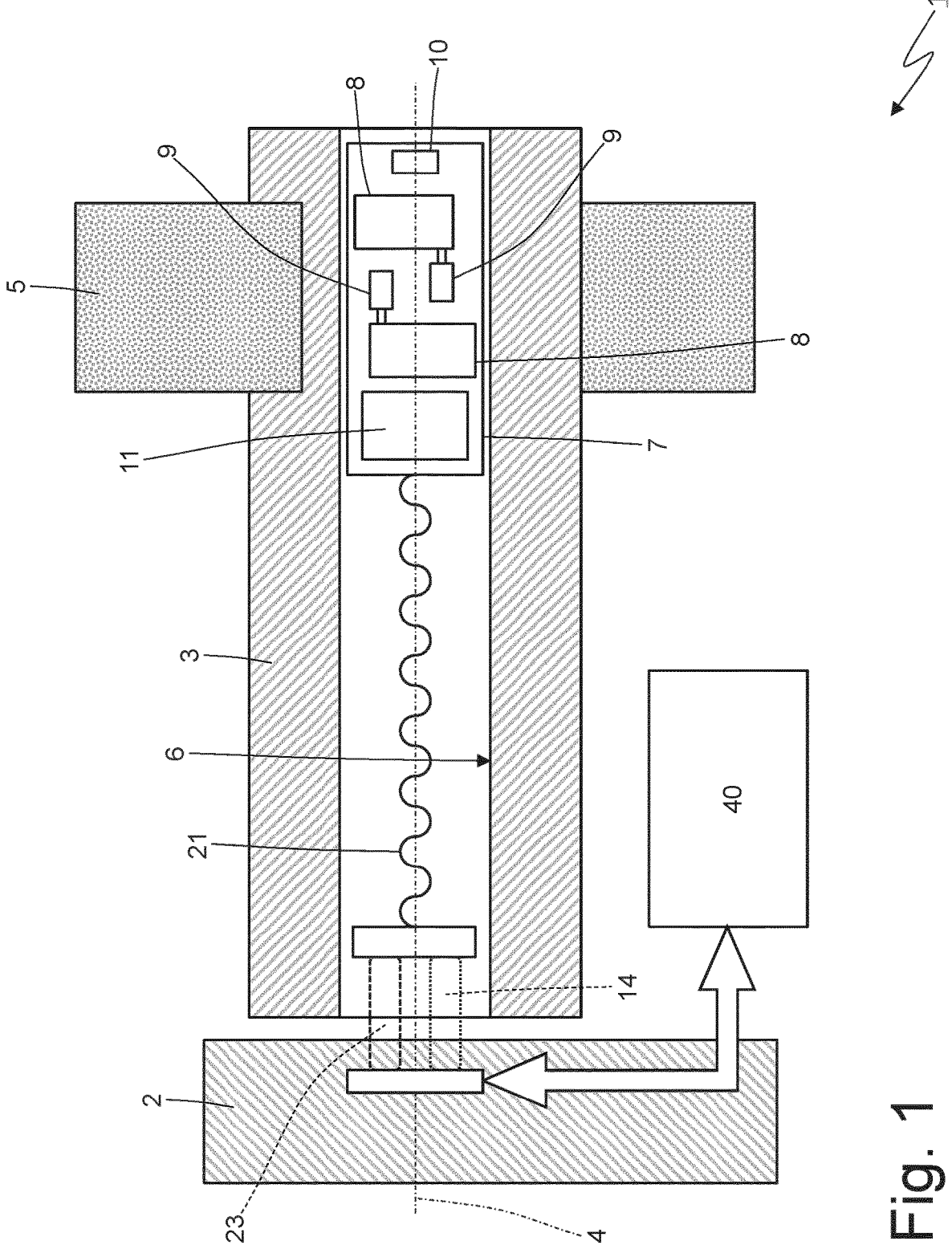
FIG. 1 shows schematically a machine tool provided with a rotating spindle which supports a grinding wheel and is provided with a balancing head.

In FIG. 1, the reference number 1 indicates as a whole a machine tool (in particular a grinding machine), only some components of which are shown.

Typically, the machine tool comprises a stationary part, or stationary component, and a movable part, or movable component, connected to each other. In a grinding machine the movable component is generally rotating with respect to the stationary component.

The machine tool 1 shown in FIG. 1 comprises a frame 2 (i.e. a stationary part) which supports in a rotatable way (by arranging bearings therebetween) a spindle 3 which rotates about a rotation axis 4.

The spindle 3 supports a grinding wheel 5 by means of a corresponding grinding wheel hub which is fixed to the spindle 3 in a removable way by means of known and not illustrated means comprising, for example, a cone coupling. The spindle 3 and the grinding wheel hub define the rotating part of the machine tool 1, which is also called rotor. The spindle 3 has in the center an axial opening 6 housing a balancing head 7. The balancing head 7, of a known type, comprises two balancing masses 8, which are eccentric with respect to the rotation axis 4, and respective electric motors 9 for adjusting the angular position of the balancing masses 8. The rotating part further comprises (at least) one acoustic sensor 10 or vibration sensor. In FIG. 1 the acoustic sensor 10 is integrated into the balancing head 7, but it could also not be integrated into the balancing head 7 and arranged in a different area of the rotating part, as shown for example in FIG. 2.

The function of the balancing head 7 is to balance the grinding wheel 5. Such operation is generally carried out whenever the grinding wheel 5 is replaced and when it is necessary as a result of the wear of the grinding wheel 5.

The balancing head 7 comprises a control device 11, which controls the operation of the balancing head 7.

It is possible that the balancing head 7 described and shown in the figures is not present and that the rotating part comprises only the acoustic sensor 10 or a plurality of acoustic sensors.

The acoustic sensor 10 and the balancing head 7 (if provided), are part of a monitoring system 12 which is connected to a processing unit 40 arranged in a fixed position (i.e. supported by the frame 2 of the machine tool 1). The monitoring system 12 is configured to provide the processing unit 40 mounted on the frame 2 (i.e. in the stationary part of the machine tool 1) with a signal relating to the vibrations to which the spindle 3 (i.e. a component of the rotating part of the machine tool 1) is subjected machine tool 1 at the grinding wheel 5.

FIGS. 2-6 show a monitoring system 12 in which the acoustic sensor 10, unlike the embodiment of FIG. 1, is not integrated into the balancing head 7.

The dashed boxes shown in the figures represent the physical division between the rotating part and the stationary part of the machine tool; the arrangement of the single components of the monitoring system 12 may be different from the one shown in the figures.

Figure 2:
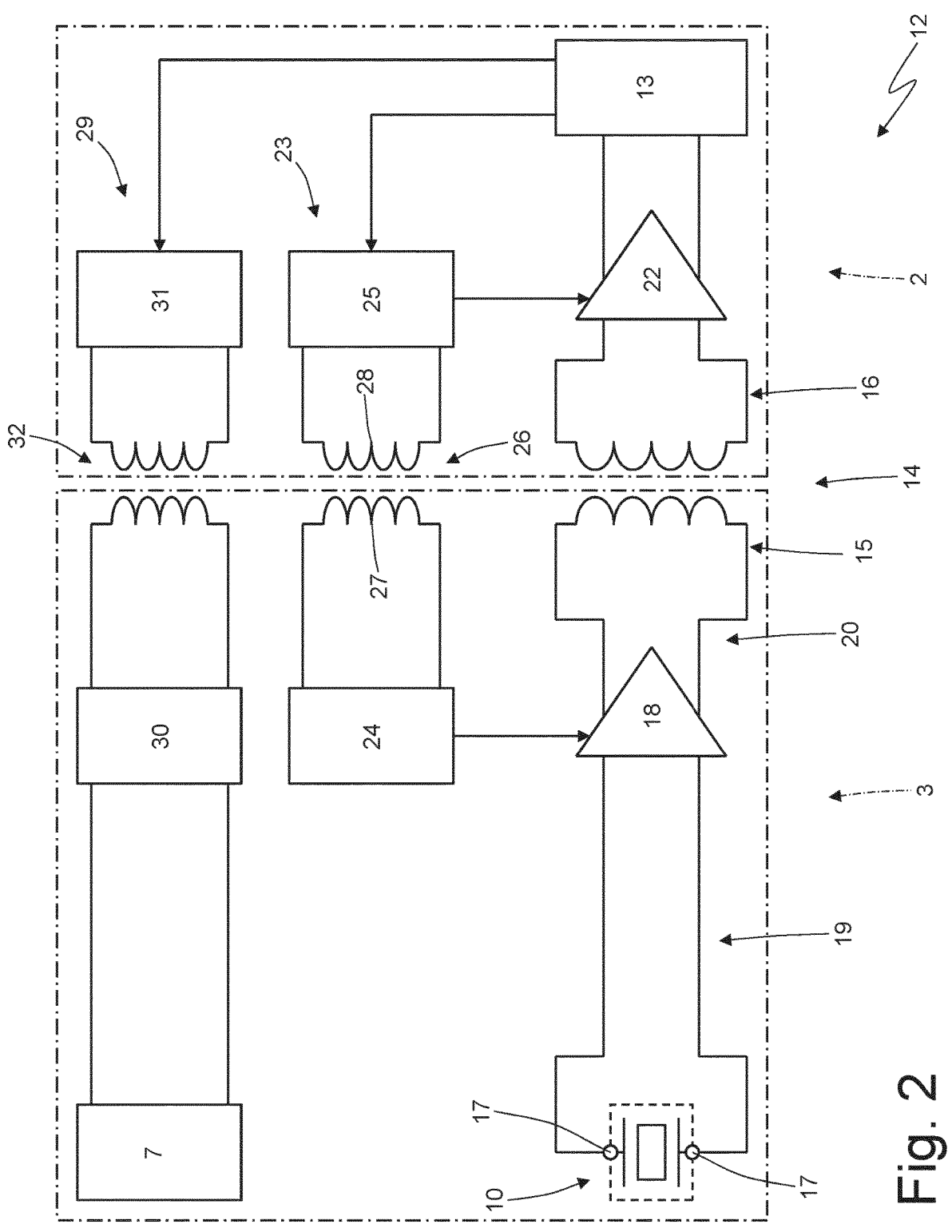
FIG. 2 shows schematically a monitoring system according to the present invention.

As shown in FIG. 2, the monitoring system 12 comprises a contactless communication unit 14 provided with a first transceiver device 15 positioned in the spindle 3 (i.e. in the rotating part of the machine tool 1) and a second transceiver device 16 which faces the transceiver device 15 and is positioned in the frame 2 (i.e. in the stationary part of the machine tool 1). The two transceiver devices 15 and 16 are adapted to communicate with each other in a contactless and known way in order to send information from the transceiver device 15 to the transceiver device 16 or vice versa. The stationary part includes an interface unit 13, which distributes the power supply to the components of the monitoring system 12 and transmits signals exiting or entering the processing unit 40.

The communication unit 14 is used in one direction by the interface unit 13 to send control signals (for example to activate/deactivate the reading of the acoustic sensor 10 or to control the electric motors 9 which displace the balancing masses 8 of the balancing head 7) coming from the processing unit 40 and/or from a control unit of the machine tool (not shown in the figures), and it is used in the opposite direction to transmit diagnostic signals (generated in the balancing head 7) to the interface unit 13 and/or signals relating to the vibrations to which the spindle is subjected.

As shown in FIG. 2, the acoustic sensor 10 comprises two terminals 17 between which a variable electrical voltage is generated (that is an analog signal) which depends on the intensity and frequency of the vibrations detected by the vibration sensor 10 itself.

The monitoring system 12 comprises an amplifier 18, which is placed inside the rotor (i.e. in the rotating part of the machine tool 1) and comprises two input terminals and two output terminals.

The monitoring system 12 comprises a first connection line 19 which connects the acoustic sensor 10 to the amplifier 18 and comprises two independent (i.e. electrically insulated) electrical leads, each of which connects a terminal 17 of the vibration sensor 10 to a corresponding input terminal of the amplifier 18.

The monitoring system 12 comprises a second connection line 20 which connects the amplifier 18 to the transceiver device 15 and comprises two independent (i.e. electrically insulated) electrical leads, each of which connects an output terminal of the amplifier 18 to the transceiver device 15.

In particular, the amplifier 18 is arranged close to the acoustic sensor 10.

In the embodiment shown in FIG. 1, where the acoustic sensor 10 in integrated into the balancing head 7, the amplifier 18 can be positioned in the control device 11 of the balancing head 7 or be integrated into the acoustic sensor 10. The connection line 20 is integrated into a multipolar electric cable 21, preferably coiled, which runs along the axial opening 6 and which comprises in addition to the connection line 20 one or more power lines (i.e. lines transmitting electrical power for operating the balancing head 7).

In the embodiment shown in FIG. 2, the communication unit 14 transmits analog signals in a contactless way by means of an inductive coupling. According to a different embodiment (not shown), the communication unit 14 transmits analog signals in a contactless way by means of an optical coupling (for example according to one of the alternatives described in the U.S. Pat. No. 5,688,160A). The transceiver device 15 receives an electric voltage and an electric current which vary depending on the vibrations detected by the acoustic sensor 10 and transmits (induces) through the inductive coupling to the transceiver device 16 a corresponding electric voltage and a corresponding electric current. Consequently, an analog signal of the electrical type exits the transceiver device 16. Preferably, the monitoring system 12 comprises an amplifier 22, which is positioned in the frame 2 (i.e. in the stationary part of the machine tool 1) and comprises two input terminals connected to the transceiver device 16 and two output terminals connected to the interface unit 13 which, as previously mentioned, is configured to process a signal generated by the acoustic sensor 10.

The monitoring system 12 comprises a power supply circuit 23 provided with a first power supply device 24 which is positioned in the rotor (i.e. in the rotating part of the machine tool 1) and supplies electrical power to the amplifier 18, and with a second power supply device 25 which is positioned in the frame 2 (i.e. in the stationary part of the machine tool 1), supplies electrical power to the amplifier 22 and to the power supply device 24, and receives electrical power from the interface unit 13. Thanks to the presence of the amplifiers 18 and 22 (necessarily powered) the signal conditioning is improved and is more powerful than in the case of a direct connection between the acoustic sensor 10 and the transceiver device 15. Furthermore, the power supply circuit 23 is provided with an air-coupled transformer 26 having a first coil 27 which is positioned in the rotor (i.e. in the rotating component of the machine tool 1) and supplies electrical power to the power supply device 24 and a second coil 28 which is positioned in the frame 2 (i.e. in the stationary part of the machine tool 1) and receives electrical power from the power supply device 25. In the embodiment shown in FIG. 2, the power supply device 24 is directly connected to the coil 27 of the air-coupled transformer 26; that is, the power supply device 24 receives electrical power directly from the coil 27 of the air-coupled transformer 26 without intermediaries.

FIG. 2 also shows a further power supply circuit 29 which is completely separate and independent from the power supply circuit 23 of the monitoring system 12, and supplies electrical power to the balancing head 7. This power supply circuit 29 is present when the balancing head 7 is present. The power supply circuit 29 comprises for example a power supply device 30 which is positioned in the rotor (i.e. in the rotating component of the machine tool 1) and supplies electrical power to the balancing head 7 and a power supply device 31 which is positioned in the frame 2 (i.e. in the stationary part of the machine tool 1), supplies electrical power to the power supply device 30 through an air-coupled transformer 32, and receives electrical power from the interface unit 13.

In the embodiments illustrated in FIGS. 2-5, the balancing head 7 is fed by the power supply circuit 29 which supplies electrical power only to the balancing head 7 and is separate and independent from the power supply circuit 23 of the monitoring system 12. In the embodiment shown in FIG. 6, only the power supply circuit 23 is provided and it is shared by the entire monitoring system 12, including the balancing head 7. In other words, the power supply circuit 23 also supplies electrical power to the balancing head 7.

Figure 3:
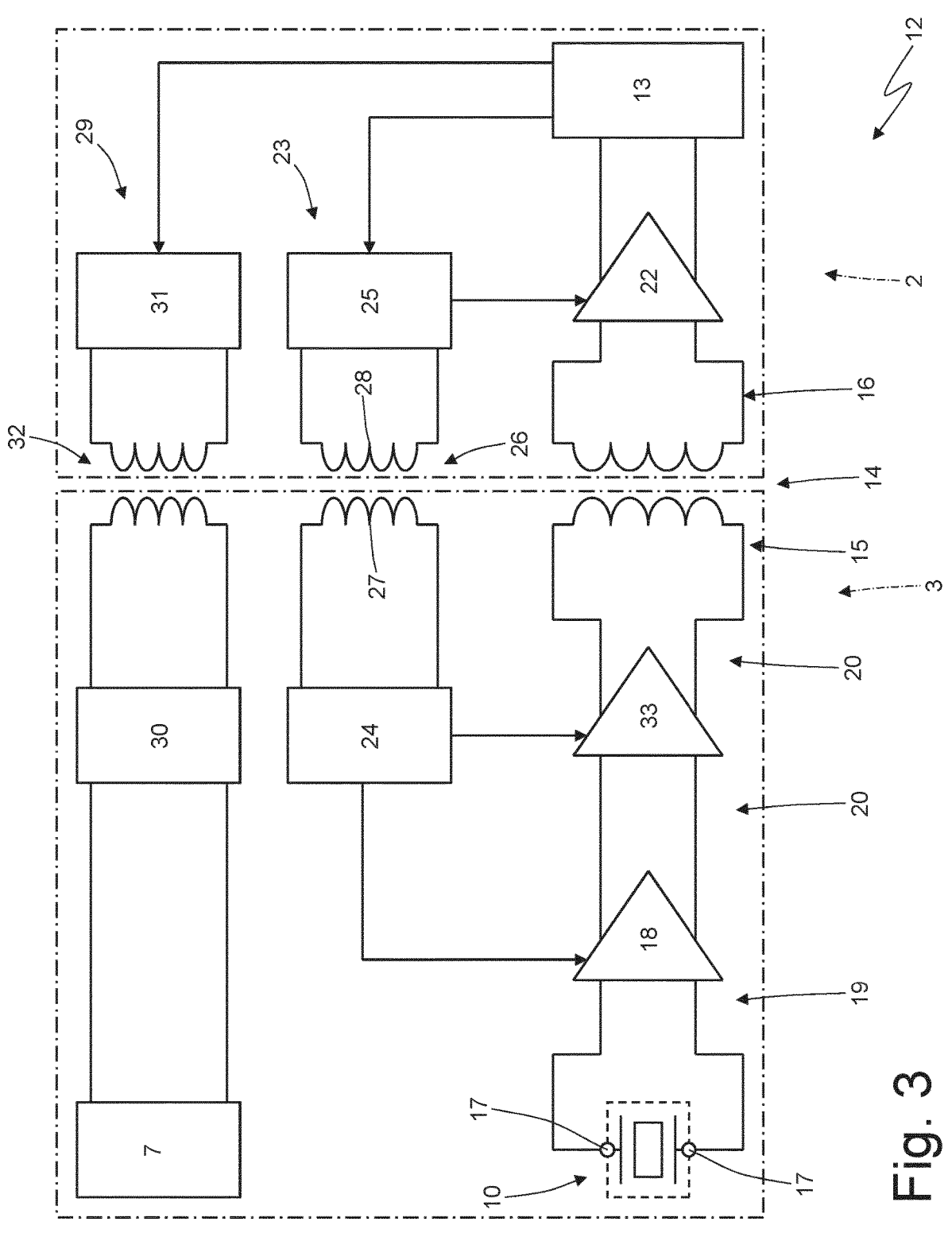
FIGS. 3-7 are a series of schematic views of alternative embodiments of the monitoring system of FIG. 2.

In the alternative embodiment illustrated in FIG. 3, the monitoring system 12 comprises a further amplifier 33, which is positioned in the rotor (i.e. in the rotating component of the machine tool 1), is connected in series to the amplifier 18 along the connection line 20, and comprises two input terminals connected to the two output terminals of the amplifier 18 and two output terminals connected to the transceiver device 15. In particular, the amplifier 18 is arranged in (close) proximity to the vibration sensor 10 (i.e. at the beginning of the connection line with reference to the layout shown in the drawings) while the amplifier 33 is arranged in (close) proximity to the transceiver device 15 (i.e. to the end of the connection line 20 with reference to the layout shown in the drawings).

In the embodiment illustrated in FIG. 3, also the amplifier 33 is fed by the power supply device 24, which supplies the amplifier 18.

Figure 4:
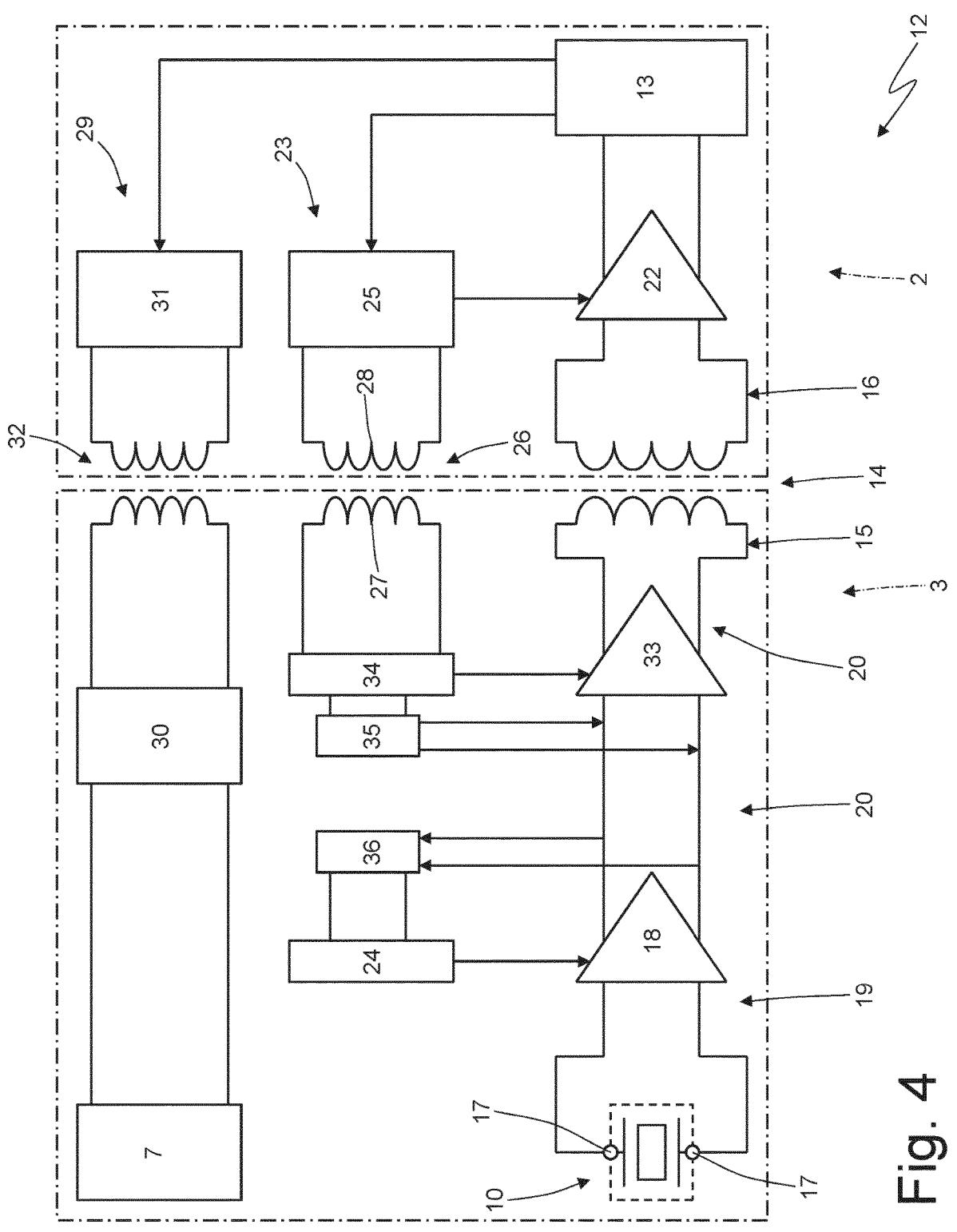

In the alternative embodiment shown in FIG. 4, the monitoring system 12 comprises a third power supply device 34 which is directly connected to the coil 27 of the air-coupled transformer 26; in other words the power supply device 4 receives electrical power directly from the coil 27 of the air-coupled transformer 26 without intermediaries. Furthermore, the monitoring system 12 comprises a coupling device 35 which receives electrical power from the power supply device 34 and feeds it into the connection line 20 in a frequency band different from a frequency band of an analog signal generated by the acoustic sensor 10, and a decoupling device 36 which takes electrical power from the connection line 20 and supplies electrical power to the power supply device 24 (which therefore receives electrical power indirectly from the coil 27 of the air-coupled transformer 26). For example, the coupling device 35 and the decoupling device 36 implement a band separation using reactive electrical components and transfer continuous electrical power or alternating electrical power having a higher or lower frequency than the analog signal generated by the acoustic sensor 10, which generally has a frequency between 1 KHz and 1 MHz.

In the embodiments shown in FIGS. 2-4, the communication unit 14 transfers an analog signal (which will be digitized in the processing unit 40) between the two transceiver devices 15 and 16. In the embodiments shown in FIGS. 5-7, the communication unit 14 transfers a digital signal between the two transceiver devices 15 and 16. The monitoring system 12 in fact comprises an analog-to-digital converter 37 which is positioned in the rotor (i.e. in the rotating component of the machine tool 1), and is configured to receive an analog signal from the amplifier 18 (with the amplifier 33 arranged therebetween if provided) and convert the analog signal into a digital signal.

Furthermore, the monitoring system 12 preferably comprises a processing device 38 which is positioned in the rotor (i.e. in the rotating component of the machine tool 1) and is configured to receive the digital signal from the analog-to-digital converter 37, to process the digital signal and obtain a processed digital signal, and to provide the processed digital signal to the transceiver device 15.

More specifically, the processing device 38 performs a time and frequency domain processing of the digital signal exiting the analog-to-digital converter 37. Preferably, this processing is based on the calculation of a Fourier transform. More specifically, this processing is carried out by using a Fast Fourier Transform (FFT).

By way of example, the signal processing may include the following steps:

selecting a frequency band of the signal and setting a gain;
sampling the signal at a frequency higher than 2 MHz;
calculating the FFT function;
zeroing in the frequency domain;
demodulating the signal spectrum to perform a check relating to the gap, that is the distance between the grinding wheel and the workpiece or dressing tool, and a check relating to the crash, that is the contact between the grinding wheel and the workpiece or dressing tool or another element of the machine tool, the demodulation being carried out independently for the two types of check;
time domain processing of the signal for each of the two types of check independently of each other;
triggering the automatic execution of the parameterization of the frequency band and of the signal gain, and triggering the zeroing of the background noise.

Optionally, it is also possible to carry out the zeroing of the background noise on the basis of its average or maximum value.

Processing the rough signal, that is the signal generated by the acoustic sensor 10, inside the rotor allows to perform a complete signal processing (for example including the steps previously described) as closely as possible to the signal source (that is the acoustic sensor 10) and to shorten significantly the propagation path of the rough signal.

In the known solutions, the analog signal generated by the sensor is transmitted as such to an external processor that converts the analog signal to a digital signal and then processes it. The processor is usually placed in electrical machine cabinets or in laboratory controllers and the processing operations are carried out without having to comply with strict constraints. However, as the propagation path of the analog signal may be quite long, the signal-to-noise ratio generally deteriorates and the quality of the signal reaching the processor can be significantly worsened.

According to other known solutions, the signal generated by the sensor is digitized in proximity of the sensor and then transmitted to an external processor for the complete processing. However, transmitting a digital signal requires a bandwidth that would be too large for contactless communication system in industrial applications. This problem has been overcome in the known solutions by obtaining the digital signal through a quantization with poor dynamics (e.g. 8 bit) and carrying out just a minimal digital processing before transmitting it. In such a way the bandwidth of the signal to be transmitted is limited but the poor digital processing that has been carried out before the signal transmission gives rise to an inevitable low performance signal processing in the external processor.

The monitoring system 12 according to the present invention allows to carry out a conversion and especially a complete processing of the signal generated by the acoustic sensor 10 in close proximity to such sensor by meeting at the same time the requirements for this kind of applications, namely high miniaturization, very low energy consumption and lower bandwidth transmission of detailed information about process monitoring.

This is achieved by combining processing devices with lower calculation power and highly optimized software algorithms. In fact, the hardware of the processing device has been designed to have lower calculation power than the devices usually employed in this kind of applications in order to reduce overall dimensions and decrease power consumption, while the software has been designed in such a way that it performs all the operations needed for the monitoring but requiring fewer resources.

According to a preferred embodiment of the present invention, to obtain the processed digital signal inside the rotor and to transmit the processed digital signal through the contactless communication unit 14, the monitoring system 12, more specifically the analog-to-digital converter 37 and the processing device 38, implement a method comprising the steps that are described below:

increasing the analog-to-digital acquisition dynamics by using a SAR (Successive Approximation Register) converter with improved resolution compared to the known solutions.
performing a high frequency acquisition of the rough base band signal generated by the acoustic sensor 10, said frequency being higher than 2 Mhz.
implementing stochastic processing for the single measurement, the stochastic processing being highly parameterizable to maintain high effectiveness as the process being monitored varies. More specifically, the digital stochastic processing techniques that are used guarantee stability and convergence properties.

implementing automatic parameter setting modes that allow the automatic parameterization of the processing based on the observation of the process being monitored. The parameters of the process generating the acoustic emission which is detected by the acoustic sensor and monitored are not known a priori, as they depend on many operating and environmental conditions. The implemented automatic parameter setting modes are defined on the basis of one or more learning phases and subsequent processing of the acquired results.

packaging the processing result, that is the processed digital signal, in such a way as to transmit real-time information with higher priority and lower priority information on the same communication channel. As previously explained, digital processing techniques generate an enormous amount of data and consequently require a large bandwidth to transmit signals. The packaging of the processed digital signal is carried out according to an optimized communication protocol that allows to define a hierarchy of information according to the latency with which the information is used. This makes it possible to transmit the processed digital signal through a contactless communication channel as provided in the monitoring system according to the present invention.

Preferably, the above described method also comprises the step of carrying out a specific processing of multiple simultaneous measurements on the basis of the same rough signal without the need to add dedicated hardware. Applications for machine tools employing acoustic sensors typically perform at least two measurements: a measurement relating to the machine operation which has higher sensitivity and narrower band to follow the machine process with maximum precision, and a monitoring measurement which has lower sensitivity and wider band to promptly identify anomalies even outside the typical process band.

The combined use of hardware and software designed as explained above allows to have a complete processing of the signal generated by the acoustic sensor 10 inside the rotor, which means the processing of a signal that not only has a good quality and a good signal-to-noise ratio but that has not been subjected to partial processing beforehand with the consequent risk of loss of information.

Figure 5:
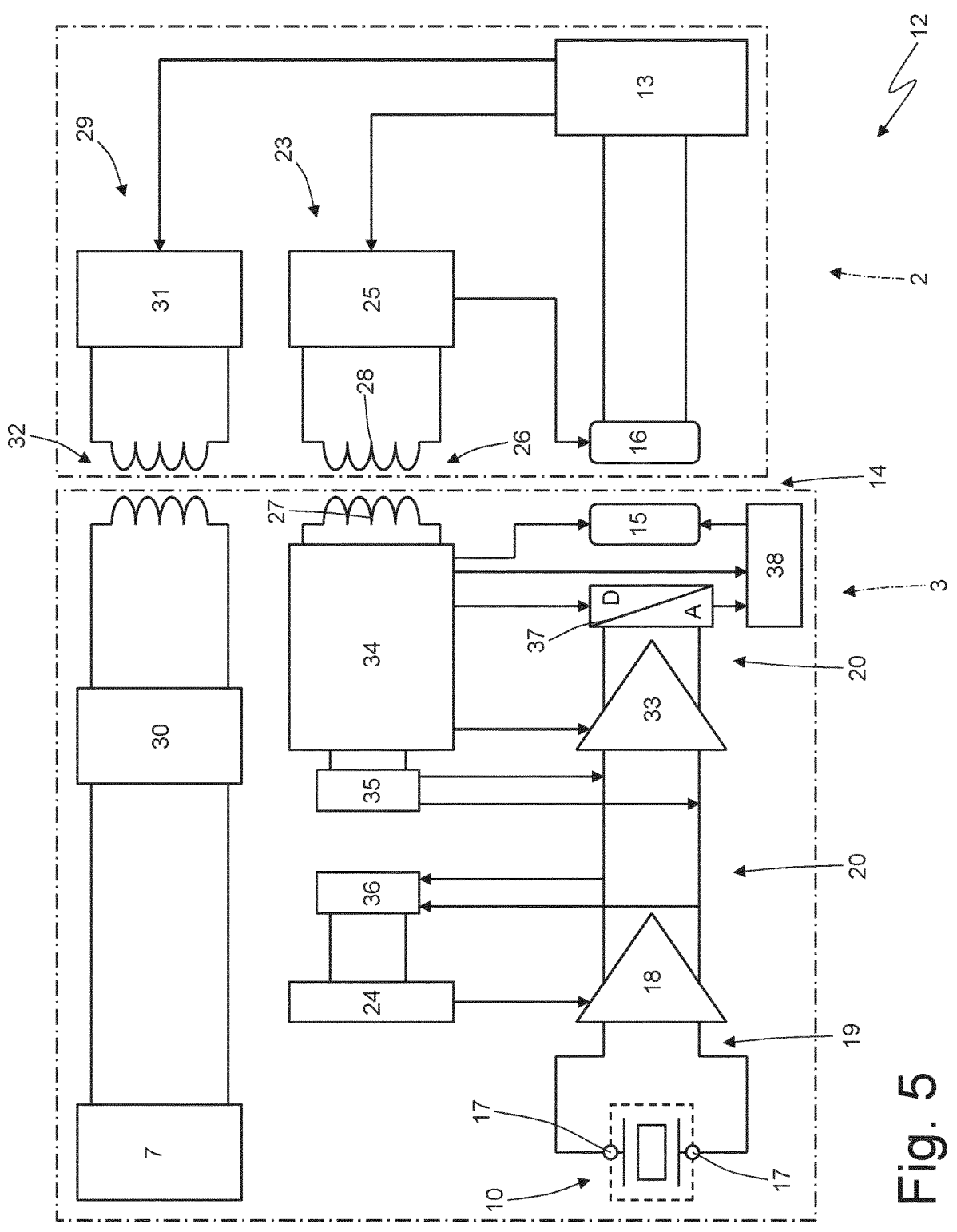

In the embodiment of FIG. 5, the transceiver device 15, the analog-to-digital converter 37 and the processing device 38 receive electrical power from the power supply device 34 while the transceiver device 16 receives electrical power from the power supply device 25.

Figure 6:
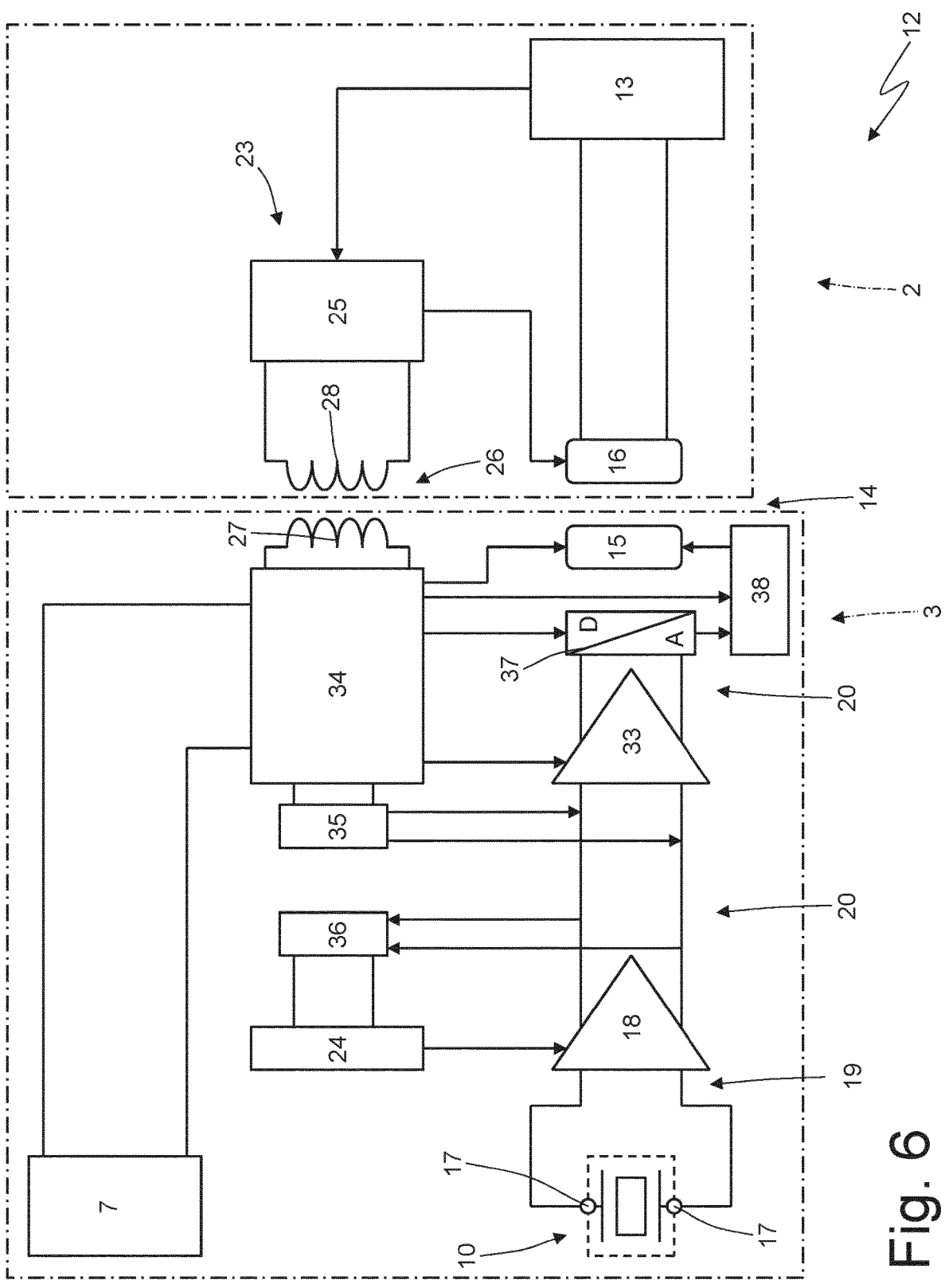

The only difference between the embodiment shown in FIG. 5 and the embodiment shown in FIG. 6 is that in the embodiment shown in FIG. 5 the power supply circuit 29 which supplies electrical power to the balancing head 7 is separate and independent from the power supply circuit 23, while in the embodiment shown in FIG. 6 only the power supply circuit 23 is provided and is shared by the entire monitoring system 12 including the balancing head 7 (in other words the power supply circuit 23 also supplies electrical power to the balancing head 7).

According to a different embodiment, not shown in the figures, the analog-to-digital converter 37 and the processing device 38 are arranged in the frame 2 (i.e. in the stationary component of the machine tool 1). The conversion of the analog signal into a digital signal and its processing do not take place in the rotating component but in the stationary component of the machine tool. This solution can be applied to the alternative embodiments of the monitoring system 12 shown in FIGS. 5, 6 and 7.

Figure 7:
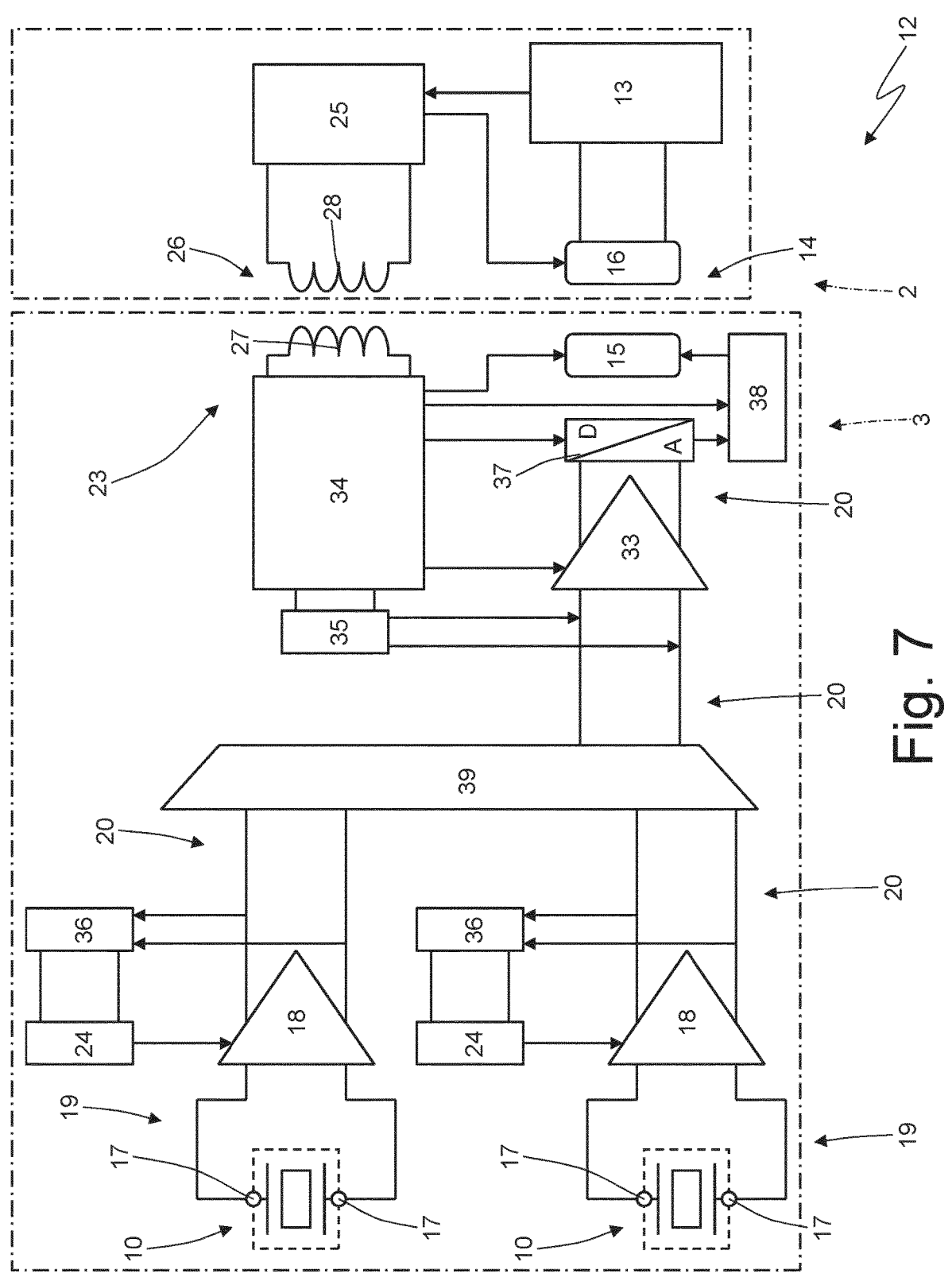

In the embodiment shown in FIG. 7, the monitoring system 12 comprises two acoustic sensors 10 which are separate and independent from each other, two amplifiers 18, and two connection lines 19, each of which connects one of the acoustic sensors 10 to an amplifier 18 and includes two independent electrical leads. Furthermore, the monitoring system 12 comprises a single communication unit 14 (which is shared between the two acoustic sensors 10), and a multiplexer 39 having two inputs connected to the two amplifiers 18 and a single output which is connected to the transceiver device 15. of the single communication unit 14. The multiplexer 39 is an input selector that receives several analog input signals and sent them alternately to a single output. The multiplexer 39 allows to have a plurality of sensors located in different areas of the rotor and to choose the signal coming from the most effective sensor for monitoring purposes depending on the operations performed by the machine tool.

Obviously, two (or more) acoustic sensors 10 and thus the multiplexer 39 can be present both when the single communication unit 14 transmits a digital signal (as shown in FIG. 7), and when the single communication unit 14 transmits an analog signal, i.e. when the monitoring system 12 does not comprise the analog-to-digital converter 37. Furthermore, two (or more) vibration sensors 10 and thus the multiplexer 39 can be present both when the power supply 34 using the coupling device 35 and the decoupling device 36 to supply electrical power to each power supply device 24 is provided (as shown in FIG. 7), and when each power supply device 24 is directly connected to the winding 27 of the air-coupled transformer 26.

According to a possible embodiment, the processing device 38 controls the multiplexer 39 to control which acoustic sensor 10 must provide the signal to the transceiver device 15 of the single communication unit 14, that is, which acoustic sensor 10 has to be read. The multiplexer 39 can be configured statically or, alternatively, dynamically, i.e. to connect in a cyclic and alternate way each input to the output under a defined switching frequency. The multiplexer 39 can be controlled by the processing device 38 both when the latter is arranged in the rotor (as shown in FIG. 7) and when it is arranged in the stationary part of the machine tool.

In the embodiment shown in FIG. 7, two acoustic sensors 10 connected to the multiplexer 39 (through the respective amplifiers 18) are provided. According to other embodiments not shown in the figures, three or more acoustic sensors 10 connected to the multiplexer 39 (through the respective amplifiers 18) are provided; all these sensors or some of them could not be acoustic sensors.

The presence of a plurality of acoustic sensors and a multiplexer is shown and described so far with reference to a monitoring system 12 in which the signal processing takes place in the stationary part or in the rotating part of the machine tool. As mentioned above, a plurality of sensors and a multiplexer could also be present in the alternative embodiments of the monitoring system 12 shown in FIGS. 2-4, where the signal processing takes place in the processing unit 40. In these cases, the processing unit 40 controls the multiplexer.

Traditionally, the reading of the acoustic sensor 10 is used by the processing unit only during the machining of a workpiece or during the maintenance or dressing of the grinding wheel to detect the ultrasonic acoustic emissions caused by the contact between the grinding wheel and the workpiece or between the grinding wheel and a dressing tool (dresser. The reading of the vibration sensor is thus traditionally used (in a known way) only for checking machining cycles or maintenance cycles.

It is also possible that the processing unit 40 uses the reading of the acoustic sensor 10 also during the movement of the spindle 3 to and from the workpiece and/or during the assembly and disassembly of the workpiece to detect any peaks of vibrations (i.e. peaks of acoustic emissions) due to undesired crashes (and due to errors in the control) between the spindle 3 and the workpiece and/or between the spindle 3 and other parts of the machine tool 1. In other words, the acoustic sensor 10 (i.e. the monitoring system 12 comprising the acoustic sensor 10) is used by the processing unit 40 as a "sentinel" of any unwanted crashes involving the spindle 3 when the spindle 3 is displaced o when the workpiece moves near the spindle 3. Obviously, when the signal provided by the acoustic sensor 10 indicates a (possible) crash, the processing unit 40 immediately signals it to the control unit of the machine tool which, if necessary, stops the ongoing movements. It is also possible that this type of events is recorded by the processing unit 40 and/or by the control unit of the machine tool to allow to reconstruct in the future all the negative events to which spindle 3 has been subjected.

In the embodiment described above, vibration sensors 10 are used, while according to other embodiments (not shown) sensors of different types are used (for example temperature sensors, pressure sensors, acceleration sensors, etc.).

In the above described embodiment, the movable part is a spindle 3 of a machine tool 1, while according to other embodiments (not shown) the movable part is a part which has a different function in a machine tool 1 or in another type of machine.

The embodiments described here can be combined with each other without departing from the scope of protection of the present invention.

The monitoring system 12 described above provides several advantages.

First, the monitoring system 12 described above allows to improve the signal-to-noise ratio by increasing the accuracy, sensitivity and stability of the reading of the acoustic sensor 10. This result is obtained in particular thanks to the presence of a transmission line suitable for providing a differential signal. The transmission line defines a signal path. Throughout this transmission line the signal path is fully differential, that is both the inputs and the outputs of every component forming part of the transmission line are differential and the operations performed by every components are differential.

This transmission line starts from the acoustic sensor 10, includes the first connection line 19, the amplifier 18 and the second connection line 20 and ends at the transceiver device 15 of the communication unit 14. Throughout its path, the signal is always fully differential and has both high quality and strong immunity to perturbations.

According to a preferred embodiment, the transmission line of the differential signal goes from the acoustic sensor 10 to the processing unit 40 passing through the communication unit 14 (also configured to maintain the signal path fully differential), the amplifier 22, the interface unit 13 and the respective electrical leads. In other words, according to the preferred embodiment, also the contactless communication unit 14, the amplifier 22 comprising the two input terminals connected to the second transmission device 16 and the two output terminals connected to the interface unit

13, the interface unit (13) itself and any electrical leads connecting the latter to the processing unit 40 form part of the transmission line providing a differential signal.

In the embodiments illustrated in FIGS. 4-7, a single connection line 20 allows to transmit to the acoustic sensor 10 both the electrical power and the signal of the vibration sensor 10. This allows to reduce significantly the number of electrical leads needed for the system with evident advantages in terms of miniaturization.

In the embodiment shown in FIG. 7, the greater the number of inputs of the multiplexer the greater the above mentioned advantages.

In the embodiments shown in FIGS. 5-7, the analog signal generated by the acoustic sensor 10 is digitized in the rotor and therefore the communication unit 14 transmit contactlessly a digital signal which, unlike an analog signal, is not subjected to noise or attenuation.

In the embodiments shown in FIGS. 5-7, thanks to the presence of the processing device 38, the signal generated by the acoustic sensor 10 is subjected to a processing already in the movable component (or, according to an alternative embodiment not shown, in the stationary component), allowing to improve the signal-to-noise ratio significantly.

Moreover, in addition to the advantages previously mentioned, performing the complete processing of the signal, or most of such processing, inside the rotor provides further remarkable advantages.

First of all, since the monitoring system, more specifically the rotor, is more powerful and has a higher autonomy, i.e. it performs more complex operations autonomously, the workload on the control devices is reduced considerably. It is thus possible to improve the system by increasing for example the number and/or the kind of monitoring processes, such as adding more sensors and/or performing more types of checking.

Furthermore, performing the complete processing of the signal, or most of such processing, inside the rotor allows the possibility of self-configuration of the monitoring system on the basis of the processed signal and the possibility of implementing self-diagnostic functions in the monitoring system such as measuring temperature, voltage or other system parameters and checking the reliability of the communication channel.

The processing of the signal generated by the acoustic sensor 10 can take place in the movable component (or, according to an alternative embodiment not shown, in the stationary component) even in a monitoring system that does not include a transmission line adapted for providing a differential signal.

Likewise, it is possible to use a multiplexer also in a monitoring system comprising a plurality of sensors (and a balancing head if present) which does not include a transmission line adapted for providing a differential signal.

The invention claimed is:

1. A monitoring system for a movable component connected to a stationary component, the monitoring system being connected to a processing unit and comprising:

an acoustic sensor positioned in the movable component;

a first amplifier positioned in the movable component;

a contactless communication unit comprising a first transceiver placed in the movable component and a second transceiver facing the first transceiver and placed in the stationary component;

a first connection line connecting the acoustic sensor to the first amplifier;

a second connection line connecting the first amplifier to the first transceiver;

an analog-to-digital converter positioned in the movable component and configured to receive an analog signal from the first amplifier and to convert the analog signal to a digital signal; and a processor positioned in the movable component and configured to receive the digital signal from the analog-to-digital converter, to process the digital signal, and to output the processed digital signal.

2. The monitoring system of claim 1, wherein the digital signal is processed in the time domain and in the frequency domain.

3. The monitoring system of claim 2, wherein the digital signal is processed using a Fourier Transform.

4. The monitoring system of claim 3, wherein the digital signal is processed using a Fast Fourier Transform.

5. The monitoring system of claim 1, further comprising a second amplifier positioned in the movable component and connected in series to the first amplifier along the second connection line.

6. The monitoring system of claim 1, further comprising a power supply circuit comprising:

a first power supply positioned in the movable component and configured to provide electrical power to the first amplifier;

an air-coupled transformer comprising (i) a first coil positioned in the movable component and configured to provide electrical power to the first power supply, and (ii) a second coil positioned in the stationary component and configured to receive electrical power;

a second power supply positioned in the stationary component configured to provide electrical power to (i) the second coil and (ii) a third amplifier positioned in the stationary component or the second transceiver;

a third power supply coupled directly to the first coil;

a coupler configured to receive electrical power from the third power supply and to feed electrical power into the second connection line, the electrical power being in a frequency band differing from a frequency band of an analog signal generated by the acoustic sensor; and a decoupler configured to receive electrical power from the second connection line and to provide electrical power to the first amplifier.

7. The monitoring system of claim 1, further comprising a transmission line configured to provide a differential signal, the transmission line comprising:

the first amplifier that comprises two electrical input terminals and two electrical output terminals;

the first connection line that comprises two electrical leads, each of the two electrical leads of the first connection line connecting an electrical terminal of the acoustic sensor to a corresponding electrical input terminal of the first amplifier; and the second connection line that comprises two electrical leads, each of the two electrical leads of the second connection line connecting an electrical output terminal of the first amplifier to the first transceiver.

8. The monitoring system of claim 7, further comprising a third amplifier positioned in the stationary component, the third amplifier comprising two electrical input terminals connected to the second transceiver and two electrical output terminals configured to be connected to an interface unit configured to distribute electrical power and transmit signals to and from the processing unit connected to the monitoring system.

9. The monitoring system of claim 7, wherein the transmission line starts from the acoustic sensor and ends at the processing unit connected to the monitoring system.

10. The monitoring system of claim 1, further comprising:

a second acoustic sensor positioned in the movable component;

a third amplifier positioned in the movable component;

a third connection line connecting the second acoustic sensor to the third amplifier; and a multiplexer comprising a first electrical input terminal connected to the first amplifier, a second electrical input terminal connected to the third amplifier, and a single electrical output terminal connected to the first transceiver, wherein the multiplexer is configured to alternatively send input signals received from the first amplifier and the third amplifier to the first transceiver.

11. The monitoring system of claim 1, further comprising a balancing head.

12. A method for obtaining a processed digital signal for the monitoring system of claim 1 and for transmitting the processed digital signal through the contactless communication unit of the monitoring system, the method comprising:

increasing resolution of the analog-to-digital converter using a Successive Approximation Register converter;

performing a high frequency acquisition of a base band signal generated by the acoustic sensor, the frequency being higher than 2 Mhz;

implementing highly parameterizable stochastic processing;

implementing automatic parameter setting modes to enable automatic parameterization of the processing based on the process being monitored; and packaging the processed digital signal to transmit real-time information with higher priority and lower priority information on the same communication channel according to a communication protocol that defines a hierarchy of information according to latency.

13. The method of claim 12, further comprising processing of multiple simultaneous measurements based on the same base band signal.

14. The monitoring system of claim 1, wherein the processor is configured to process the digital signal by sampling the digital signal at a frequency higher than 2 MHz.

15. The monitoring system of claim 1, wherein the processor is configured to process the digital signal by implementing highly parameterizable stochastic processing.

16. The monitoring system of claim 1, wherein the processor is configured to process the digital signal by demodulating the digital signal spectrum to perform a check relating to a distance between the movable component and the stationary component.

17. The monitoring system of claim 1, wherein the processor is configured to process the digital signal by demodulating the digital signal spectrum to perform a check relating to contact between the movable component and the stationary component.

18. The monitoring system of claim 1, wherein the processor is configured to process the digital signal by zeroing background noise.

19. The monitoring system of claim 1, wherein the processor is configured to output the processed digital signal according to a communication protocol that defines a hierarchy of information according to latency.

* * * * *